(12) United States Patent
Tachibana et al.

(10) Patent No.: US 9,590,141 B2
(45) Date of Patent: *Mar. 7, 2017

(54) SEMICONDUCTOR LIGHT EMITTING DEVICE HAVING A P-TYPE SEMICONDUCTOR LAYER WITH A P-TYPE IMPURITY

(71) Applicant: Kabushiki Kaisha Toshiba, Tokyo (JP)

(72) Inventors: Koichi Tachibana, Kanagawa-ken (JP); Hajime Nago, Kanagawa-ken (JP); Toshiki Hikosaka, Kanagawa-ken (JP); Shigeya Kimura, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/732,981

(22) Filed: Jun. 8, 2015

(65) Prior Publication Data

US 2015/0270445 A1 Sep. 24, 2015

Related U.S. Application Data

(62) Division of application No. 14/175,223, filed on Feb. 7, 2014, now Pat. No. 9,093,609, which is a division
(Continued)

(30) Foreign Application Priority Data

Dec. 1, 2010 (JP) .................................. 2010-268431

(51) Int. Cl.
*H01L 33/06* (2010.01)
*H01L 33/32* (2010.01)
(Continued)

(52) U.S. Cl.
CPC ............ *H01L 33/325* (2013.01); *H01L 33/02* (2013.01); *H01L 33/32* (2013.01); *H01L 33/40* (2013.01); *H01S 5/32341* (2013.01); *H01L 33/06* (2013.01)

(58) Field of Classification Search
CPC ........ H01L 33/06; H01L 33/32; H01L 33/325
See application file for complete search history.

(56) References Cited

U.S. PATENT DOCUMENTS 5,670,798 A * 9/1997 Schetzina ............. H01L 29/205
257/101
5,679,965 A * 10/1997 Schetzina ............. B82Y 20/00
257/103
(Continued)

FOREIGN PATENT DOCUMENTS

JP 11-68155 3/1999
JP 2000-164922 6/2000
(Continued)

OTHER PUBLICATIONS

Office Action issued Jul. 31, 2015 in Japanese Patent Application No. 2014-183654 (with English language translation).
(Continued)

*Primary Examiner* — Evan Pert
(74) *Attorney, Agent, or Firm* — Oblon, McClelland, Maier & Neustadt, L.L.P.

(57) ABSTRACT

According to one embodiment, a semiconductor light emitting device includes an n-type semiconductor layer, a p-type semiconductor layer, a light emitting part, and a p-side electrode. The light emitting part is provided between the n-type and the p-type semiconductor layers, and includes a plurality of barrier layers and a plurality of well layers. The p-side electrode contacts the p-type semiconductor layer. The p-type semiconductor layer includes first, second, third, and fourth p-type layers. The first p-type layer contacts the
(Continued)

p-side electrode. The second p-type layer contacts the light emitting part. The third p-type layer is provided between the first p-type layer and the second p-type layer. The fourth p-type layer is provided between the second p-type layer and the third p-type layer. The second p-type layer contains Al and contains a p-type impurity in a lower concentration lower than that in the first concentration.

16 Claims, 7 Drawing Sheets

Related U.S. Application Data of application No. 13/198,105, filed on Aug. 4, 2011, now Pat. No. 8,698,192.

(51) Int. Cl.
    *H01L 33/40* (2010.01)
    *H01S 5/323* (2006.01)
    *H01L 33/02* (2010.01)

(56) References Cited

U.S. PATENT DOCUMENTS

| | | | | |
|---|---|---|---|---|
| 5,777,350 | A | * | 7/1998 | Nakamura ............ B82Y 20/00 257/103 |
| 5,793,054 | A | * | 8/1998 | Nido ...................... B82Y 20/00 257/103 |
| 7,098,484 | B2 | | 8/2006 | Yamanaka et al. |
| 7,459,326 | B2 | | 12/2008 | Yamanaka et al. |
| 7,714,350 | B2 | | 5/2010 | Sugawara et al. |
| 8,525,203 | B2 | | 9/2013 | Tachibana et al. |
| 8,643,044 | B2 | | 2/2014 | Tachibana et al. |
| 8,648,381 | B2 | | 2/2014 | Tachibana et al. |
| 2005/0035360 | A1 | | 2/2005 | Tanizawa |
| 2007/0145406 | A1 | | 6/2007 | Han et al. |

FOREIGN PATENT DOCUMENTS

| | | |
|---|---|---|
| JP | 2000-208875 | 7/2000 |
| JP | 2001-148507 | 5/2001 |
| JP | 3314666 | 6/2002 |
| JP | 2008-177213 | 7/2008 |
| JP | 2008-251849 | 10/2008 |
| JP | 2009-130316 | 6/2009 |

OTHER PUBLICATIONS

Office Action issued Nov. 30, 2011 in Japan Application No. 2010-268431.
Office Action issued Apr. 20, 2012 in Japan Application No. 2010-268431.
Japanese Office Action issued Aug. 14, 2012 in Patent Application No. 2010-268431.

* cited by examiner

US 9,590,141 B2

SEMICONDUCTOR LIGHT EMITTING DEVICE HAVING A P-TYPE SEMICONDUCTOR LAYER WITH A P-TYPE IMPURITY

CROSS-REFERENCE TO RELATED APPLICATIONS

This application is based upon and claims the benefit of priority from the prior Japanese Patent Application No. 2010-268431, filed on Dec. 1, 2010; the entire contents of which are hereby incorporated by reference. The present application is a Divisional of U.S. application Ser. No. 14/175,223, filed Feb. 7, 2014, now allowed, which is a Divisional of U.S. application Ser. No. 13/198,105, filed Aug. 4, 2011, now U.S. Pat. No. 8,698,192.

FIELD

Embodiments described herein relate generally to semiconductor light emitting device.

BACKGROUND

By applying a nitride semiconductor, for example, semiconductor light emitting devices such as light emitting diodes (LEDs) of UV, blue and green and laser diodes (LDs) of blue-violet, blue and green have been developed.

In order to enhance the efficiency of semiconductor light emitting devices, it is important to enhance the crystallinity of the semiconductor layer, to reduce nonradiative recombination centers, and to enhance the internal quantum efficiency. Moreover, the activation rate of p-type impurities in the semiconductor layer is low. Consequently, the density of holes tends to be low. Therefore, the improvement of the injection efficiency of holes is required. Moreover, the reduction of operating voltage is required in semiconductor light emitting devices.

DETAILED DESCRIPTION

Figure 1:
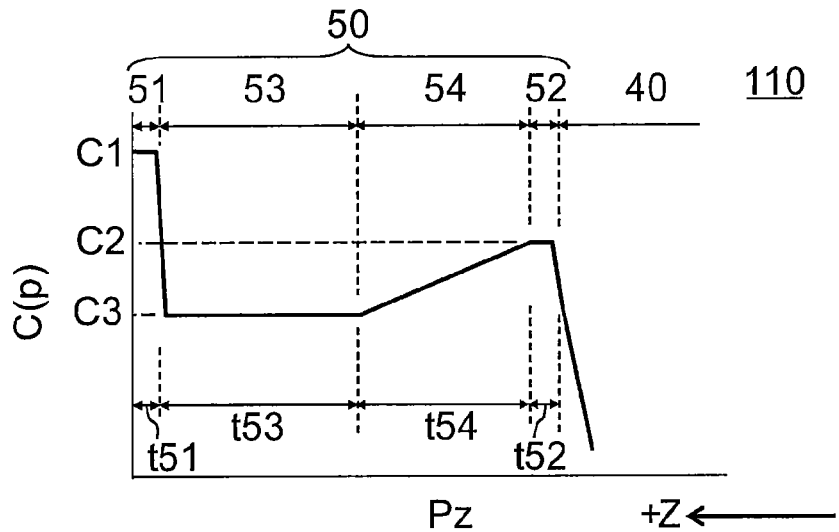
FIG. 1 is a schematic view showing a semiconductor light emitting device according to an embodiment.

In general, according to one embodiment, a semiconductor light emitting device includes an n-type semiconductor layer, a p-type semiconductor layer, a light emitting part, and a p-side electrode. The light emitting part is provided between the n-type semiconductor layer and the p-type semiconductor layer, and includes a plurality of barrier layers and a plurality of well layers. The well layers are provided between the barrier layers. The p-side electrode contacts the p-type semiconductor layer. The p-type semiconductor layer includes a first p-type layer, a second p-type layer, a third p-type layer, and a fourth p-type layer. The first p-type layer contacts the p-side electrode and contains a p-type impurity in a first concentration. The second p-type layer contacts the light emitting part. The second p-type layer contains Al and contains a p-type impurity in a second concentration lower than the first concentration. The third p-type layer is provided between the first p-type layer and the second p-type layer. The third p-type layer contains a p-type impurity in a third concentration lower than the second concentration. The fourth p-type layer is provided between the second p-type layer and the third p-type layer. The fourth p-type layer has a concentration of a p-type impurity decreasing from the second concentration to the third concentration along a first direction from the n-type semiconductor layer toward the p-type semiconductor layer.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

Embodiment

Figure 2:
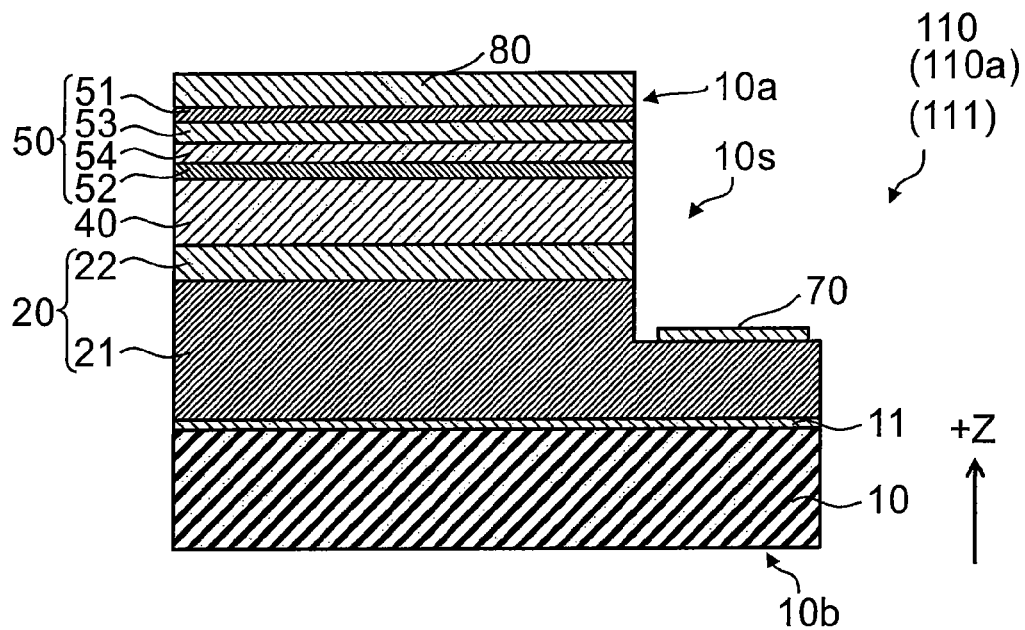
FIG. 2 is a schematic cross-sectional view showing the semiconductor light emitting device according to the embodiment.

FIG. 2 is a schematic cross-sectional view illustrating a configuration of a semiconductor light emitting device according to an embodiment.

Firstly, while referring to FIG. 2, the outline of the configuration of a semiconductor light emitting device according to the embodiment will be described.

As shown in FIG. 2, a semiconductor light emitting device 110 according to the embodiment includes an n-type semiconductor layer 20, a p-type semiconductor layer 50, a light emitting part 40, and a p-side electrode 80.

The light emitting part 40 is disposed between the n-type semiconductor layer 20 and the p-type semiconductor layer 50. The light emitting part 40 includes plural barrier layers, and plural well layers disposed between the plural barrier layers. The example of the configuration of the light emitting part 40 will be described later. The p-side electrode 80 contacts the p-type semiconductor layer 50.

Here, the direction going from the n-type semiconductor layer 20 toward the p-type semiconductor layer 50 is defined as a +Z direction (a first direction).

The p-type semiconductor layer 50 includes a first p-type layer 51, a second p-type layer 52, a third p-type layer 53, and a fourth p-type layer 54.

The first p-type layer 51 contacts the p-side electrode 80. The second p-type layer 52 contacts the light emitting part 40 between the first p-type layer 51 and the light emitting part 40. The third p-type layer 53 is disposed between the first p-type layer 51 and the second p-type layer 52. The fourth p-type layer 54 is disposed between the second p-type layer 52 and the third p-type layer 53.

The second p-type layer 52 contains Al. As the second p-type layer 52, for example, an AlGaN layer is used. The second p-type layer 52 may function, for example, as an electron overflow-suppressing layer (an electron overflow-preventing layer). The first p-type layer 51 functions as a contact layer with the p-side electrode 80. As the first p-type layer 51, the third p-type layer 53 and the fourth p-type layer 54, for example, a GaN layer is used.

The first p-type layer 51, the second p-type layer 52, the third p-type layer 53 and the fourth p-type layer 54 contain a p-type impurity. As the p-type impurity, for example, Mg (magnesium) is used. The embodiment is not limited to this, but another element may be used as the p-type impurity. That is, at least any of Mg, Zn and C may be used as the p-type impurity.

The n-type semiconductor layer 20 may include, for example, an n-type guide layer 22 and an n-type contact layer 21. The n-type guide layer 22 is disposed between the n-type contact layer 21 and the light emitting part 40. As the n-type guide layer 22, for example, a GaN layer is used. As the n-type contact layer 21, a GaN layer containing an n-type impurity is used. As the n-type impurity, for example, Si (silicon) is used. The embodiment is not limited to this, but another element may be used as the n-type impurity. That is, as the n-type impurity, at least any of Si, Ge, Te and Sn may be used.

Meanwhile, for example, a multilayer stacked body (not shown) may additionally be disposed between the n-type semiconductor layer 20 and the light emitting part 40. The multilayer stacked body includes plural thick film layers and plural thin film layers stacked alternately along the +Z direction. The thin film layer has a thickness smaller than that of the thick film layer. The thin film layer has a composition different from that of the thick film layer. The multilayer stacked body has, for example, a superlattice structure. The multilayer stacked body is disposed as needed, and may be omitted depending on conditions.

As described above, in the semiconductor light emitting device 110, a stacked structure body 10s including the n-type semiconductor layer 20, the light emitting part 40 and the p-type semiconductor layer 50 is disposed. In this example, a part on the side of a first major surface 10a of the stacked structure body 10s is selectively removed. Consequently, a part of the n-type semiconductor layer 20 (specifically the n-type contact layer 21) is exposed on the side of the first major surface 10a. On the exposed part, an n-side electrode 70 is provided. The n-side electrode 70 contacts the n-type semiconductor layer 20. The embodiment is not limited to this, but the n-side electrode 70 may be provided on the side of a second major surface 10b of the n-type semiconductor layer 20. The second major surface 10b is a surface opposite to the first major surface 10a of the stacked structure body 10s. As the n-side electrode 70, for example, a composite film of titanium-platinum-gold (Ti/Pt/Au) is used. The Ti film has a thickness, for example, of about 0.05 μm (micrometer). The Pt film has a thickness, for example, of about 0.05 μm. The Au film has a thickness, for example, of about 1.0 μm.

For the p-side electrode 80, for example, indium-tin-oxide (ITO) or the like is used. That is, the p-side electrode 80 includes a metal oxide and may have translucency for light emitted from the light emitting part 40.

As the p-side electrode 80, a composite film of nickel-gold (Ni/Au) etc. may also be used.

The semiconductor light emitting device 110 further includes a substrate 10 and a buffer layer 11. The substrate 10 and the buffer layer 11 are disposed as needed, and may be omitted.

For the substrate 10, for example, sapphire, GaN, SiC, Si, GaAs or the like is used. On the substrate 10, the buffer layer 11 is formed. As the buffer layer 11, for example, a GaN layer is used. On the buffer layer 11, the n-type semiconductor layer 20, the light emitting part 40 and the p-type semiconductor layer 50 are formed sequentially. After forming the stacked structure body 10s on the buffer layer 11, the substrate 10 may be removed.

Figure 3:
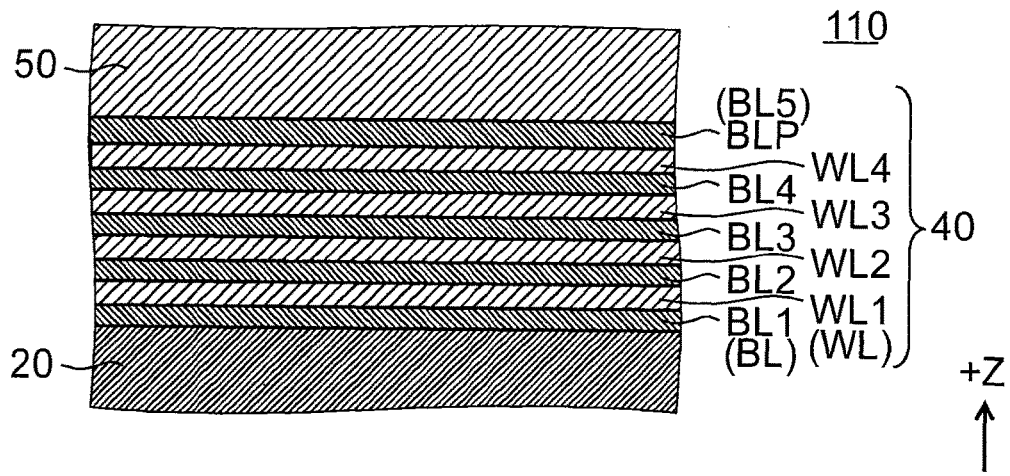
FIG. 3 is a schematic cross-sectional view showing a part of the semiconductor light emitting device according to the embodiment.

FIG. 3 is a schematic cross-sectional view illustrating the configuration of a part of the semiconductor light emitting device according to the embodiment.

FIG. 3 shows an example of the configuration of the light emitting part 40.

As shown in FIG. 3, the light emitting part 40 includes plural barrier layers BL, and plural well layers WL disposed between the plural barrier layers BL.

In this example, there are four well layers WL. But the embodiment is not limited to this. The number of the well layers WL is 2 or more, and is arbitrary. In this example, plural well layers WL are disposed. That is, the light emitting part 40 in this specific example has a multiple quantum well (MQW) structure.

Plural well layers WL include a first well layer WL1 to the nth well layer WLn. Here, "n" is an integer of 2 or more. For example, the (i+1)th well layer WL(i+1) is disposed between the ith well layer WLi and the p-type semiconductor layer 50. Here, "i" is an integer of 1 or more.

Plural barrier layers BL include a first barrier layer BL1 to nth barrier layer BLn. For example, the (i+1)th barrier layer BL(i+1) is disposed between the ith barrier layer BLi and the p-type semiconductor layer 50.

It is so defined that the ith well layer WLi is disposed between the ith barrier layer BLi and the (i+1)th barrier layer BL(i+1). Furthermore, the plural barrier layers BL have the (n+1)th barrier layer BL(n+1). The (n+1)th barrier layer BL(n+1) is, for example, a p-side barrier layer BLP.

Figure 4:
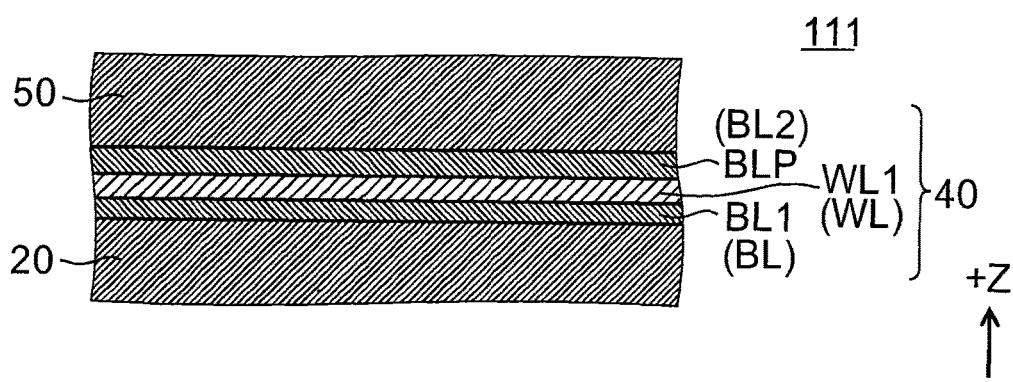
FIG. 4 is a schematic cross-sectional view showing a part of the semiconductor light emitting device according to the embodiment.

FIG. 4 is a schematic cross-sectional view illustrating the configuration of a part of the semiconductor light emitting device according to the embodiment.

FIG. 4 exemplifies the configuration of the light emitting part 40 in another semiconductor light emitting device 111 according to the embodiment. In the semiconductor light emitting device 111, the configuration other than that of the light emitting part 40 is the same as that of the semiconductor light emitting device 110 exemplified in FIG. 2, and thus the explanation thereof is omitted.

As shown in FIG. 4, in the semiconductor light emitting device 111, the light emitting part 40 includes two barrier layers BL and one well layer WL. As described above, the light emitting part 40 in the semiconductor light emitting device 111 may have a single quantum well (SQW) structure.

In this manner, the embodiment employs the MQW structure or the SQW structure.

Hereinafter, the semiconductor light emitting device 110 having the MQW structure will be described. But, the description below is also applied to the semiconductor light emitting device 111 having the SQW structure.

For the n-type semiconductor layer 20, the p-type semiconductor layer 50 and the light emitting part 40, a nitride semiconductor is used. That is, the n-type semiconductor layer 20, the p-type semiconductor layer 50 and the light emitting part 40 include the nitride semiconductor.

The well layer WL may include InGaN, and the barrier layer BL may include GaN. The band gap energy of the barrier layer BL is greater than that of the well layer WL.

The barrier layer BL may not be doped with In. That is, the barrier layer BL does not contain In substantially. The composition ratio of In among Group III elements in the well layer WL is higher than that of In among Group III elements in the barrier layer BL. That is, even in the case where the barrier layer BL contains In, the composition ratio of In of the barrier layer BL is lower than that of In of the well layer WL.

The composition ratio of In among Group III elements in the well layer WL is, for example, not less than 0.05 and not more than 0.3.

The peak wavelength of light emitted from the light emitting part 40 is not less than 380 nanometer (nm) and not more than 550 nm.

FIG. 1 is a schematic view illustrating the configuration of the semiconductor light emitting device according to the embodiment.

FIG. 1 is a graph illustrating the p-type impurity concentration in the p-type semiconductor layer 50.

In FIG. 1, the horizontal axis represents the position Pz along the +Z direction. The vertical axis represents the p-type impurity concentration C(p). The vertical axis is based, for example, on the logarithm of the p-type impurity concentration C(p).

As shown in FIG. 1, the first p-type layer 51 contains the p-type impurity in a first concentration C1.

The second p-type layer 52 contains the p-type impurity in a second concentration C2 lower than the first concentration C1.

The third p-type layer 53 contains the p-type impurity in a third concentration C3 lower than the second concentration C2.

The p-type impurity concentration C(p) in the fourth p-type layer 54 decreases from the second concentration C2 to the third concentration C3 along the +Z direction (the direction from the n-type semiconductor layer 20 toward the p-type semiconductor layer 50).

That is, the p-type impurity concentration C(p) in the p-type semiconductor layer 50 starts from the second concentration C2 of the second p-type layer 52, decreases in the fourth p-type layer 54 along the +Z direction, reaches the lowest third concentration C3 in the third p-type layer 53, and reaches the highest first concentration C1 in the first p-type layer 51.

This provides a semiconductor light emitting device of a high efficiency and a low operating voltage.

Meanwhile, the p-type impurity concentration C(p) in the fourth p-type layer 54 may change linearly along the +Z direction. The p-type impurity concentration C(p) in the fourth p-type layer 54 may change curvedly. The p-type impurity concentration C(p) in the fourth p-type layer 54 may change stepwisely with plural steps along the +Z direction.

In the above, the p-type impurity is, for example, Mg. That is, the first concentration C1 is the concentration of Mg in the first p-type layer 51. The second concentration C2 is the concentration of Mg in the second p-type layer 52. The third concentration C3 is the concentration of Mg in the third p-type layer 53. The p-type impurity concentration C(p) in the fourth p-type layer 54 is the Mg concentration in the fourth p-type layer 54.

That is, for example, the first p-type layer 51 contains Mg in the first concentration C1. The second p-type layer 52 contains Mg in the second concentration C2. The third p-type layer 53 contains Mg in the third concentration C3. The Mg concentration in the fourth p-type layer 54 decreases from the second concentration C2 to the third concentration C3 along the +Z direction.

The first concentration C1 is, for example, $2 \times 10^{20}$ cm$^{-3}$ or more. The second concentration C2 is, for example, not less than $2.5 \times 10^{19}$ cm$^{-3}$ and less than $2 \times 10^{20}$ cm$^{-3}$. The third concentration C3 is, for example, not less than $1 \times 10^{19}$ cm$^{-3}$ and less than $2.5 \times 10^{19}$ cm$^{-3}$.

For example, the third concentration C3 is not less than 0.05 times and not more than 0.8 times the second concentration C2.

In the above, the third p-type layer 53 is a layer having a substantially constant p-type impurity concentration C(p). The variation of the p-type impurity concentration C(p) in the third p-type layer 53 is, for example, within plus minus 20% of the average value of the third concentration C3.

Meanwhile, the concentration of the p-type impurity contained in respective layers of the p-type semiconductor layer 50 can be measured, for example, by a secondary ion mass spectrometry (SIMS) method etc.

Hereinafter, a semiconductor light emitting device 110a is explained. The semiconductor light emitting device 110a is one of specific examples of the semiconductor light emitting device 110. The semiconductor light emitting device 110a has the configuration exemplified in FIG. 2. The semiconductor light emitting device 110a was produced in a manner below.

Firstly, on the substrate 10 of sapphire, the buffer layer 11 was formed. On the buffer layer 11, an n-type GaN layer to be the n-type contact layer 21 was formed. The n-type contact layer 21 has a thickness of about 4 μm. The concentration of the n-type impurity (in the specific example, Si) in the n-type contact layer 21 is about $2 \times 10^{18}$ cm$^{-3}$.

On the n-type contact layer 21, a GaN layer to be the n-type guide layer 22 was formed. The n-type guide layer 22 has a thickness of about 0.1 μm. The concentration of the n-type impurity in the n-type guide layer 22 is about $1 \times 10^{18}$ cm$^{-3}$.

The growth temperature of the n-type contact layer 21 and the growth temperature of the n-type guide layer 22 are not less than 1000° C. and not more than 1100° C.

For the n-type guide layer 22, In$_{0.01}$Ga$_{0.99}$N may be used. On this occasion, the n-type guide layer 22 has a thickness of about 0.1 μm. When In$_{0.01}$Ga$_{0.99}$N is used for the n-type guide layer 22, the growth temperature of the n-type guide layer 22 is not less than 700° C. and not more than 800° C.

On the n-type guide layer 22, the light emitting part 40 was formed. That is, an In$_{0.01}$Ga$_{0.99}$N layer to be the barrier layer BL and an In$_{0.15}$Ga$_{0.85}$N layer to be the well layer WL of the light emitting part 40 were formed alternately. The barrier layer BL has a thickness of about 5 nm. The well layer WL has a thickness of about 2.5 nm. Meanwhile, the well layer WL is undoped. In the specific example, the number of the well layers WL is eight, and the number of the barrier layers BL is nine. The growth temperature of the barrier layer BL and the well layer WL is not less than 700° C. and not more than 800° C. Meanwhile, the barrier layer BL is undoped. The barrier layer BL may be doped, for example, with an n-type impurity in a concentration of about $1 \times 10^{18}$ cm$^{-3}$.

On the light emitting part 40, an Al$_{0.20}$Ga$_{0.80}$N layer to be the second p-type layer 52 was formed. The second p-type layer 52 has a thickness (a second thickness t52) of about 5 nm. The concentration of Mg in the second p-type layer 52 is about $1 \times 10^{20}$ cm$^{-3}$.

On the second p-type layer 52, a GaN layer to be the fourth p-type layer 54 was formed. The fourth p-type layer 54 has a thickness (a fourth thickness t54) of about 40 nm. In the formation of the fourth p-type layer 54, the Mg concentration in the fourth p-type layer 54 was decreased from $1 \times 10^{20}$ cm$^{-3}$ to $2 \times 10^{19}$ cm$^{-3}$. The growth temperature of the fourth p-type layer 54 is not less than 1000° C. and not more than 1100° C.

On the fourth p-type layer 54, a GaN layer to be the third p-type layer 53 was formed. The third p-type layer 53 has a thickness (a third thickness t53) of about 40 nm. The Mg concentration in the third p-type layer 53 is about $2 \times 10^{19}$ cm$^{-3}$. The growth temperature of the third p-type layer 53 is not less than 1000° C. and not more than 1100° C.

On the third p-type layer 53, a GaN layer to be the first p-type layer 51 was formed. The first p-type layer 51 has a thickness (a first thickness t51) of about 5 nm. The Mg concentration in the first p-type layer 51 is about $1 \times 10^{21}$ cm$^{-3}$.

In the manner described above, the stacked structure body 10s is formed.

On the first p-type layer 51, an ITO film to be the p-side electrode 80 is formed. Furthermore, on the p-side electrode 80, a pad electrode (not shown) is formed. The ITO film to be the p-side electrode 80 has a thickness of about 0.2 μm. As the pad electrode, a gold film having a thickness of about 1.0 μm is used.

A part of the stacked structure body 10s is subjected to dry etching to expose a part of the n-type contact layer 21. On the exposed n-type contact layer 21, a composite film of titanium-platinum-gold (Ti/Pt/Au) to be the n-side electrode 70 is formed.

This forms the semiconductor light emitting device 110a. The semiconductor light emitting device 110a emits light having a peak wavelength of 450 nm from the light emitting part 40. That is, the emitted light is blue.

Figure 5:
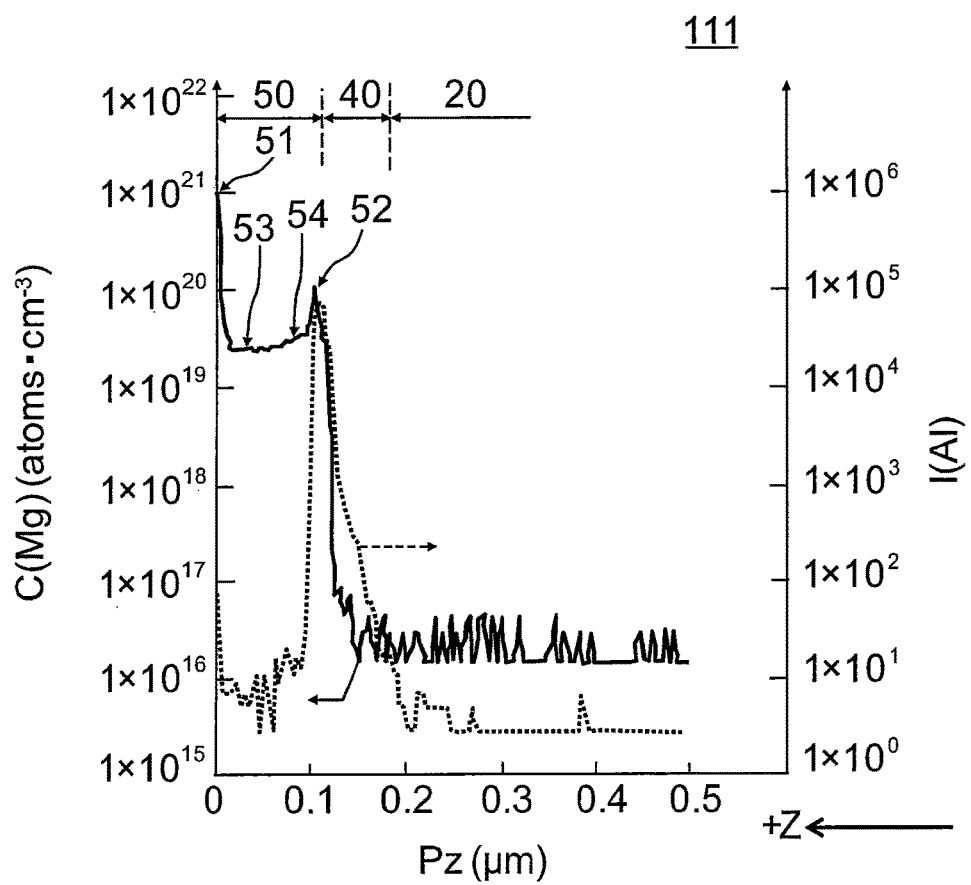
FIG. 5 is a graph showing the semiconductor light emitting device according to the embodiment.

FIG. 5 is a graph illustrating the configuration of the semiconductor light emitting device according to the embodiment.

That is, the drawing shows the result of elementary analysis of the p-type semiconductor layer 50 of the semiconductor light emitting device 110a by the SIMS method. In the drawing, the horizontal axis shows the position Pz in the +Z direction. The vertical axis on the left shows the Mg concentration C(Mg). The vertical axis on the right shows the Al secondary ion intensity I(Al). The solid line shows the Mg concentration C(Mg). The broken line shows the Al secondary ion intensity I(Al).

As shown in FIG. 5, the Al secondary ion intensity I(Al) shows a sharp peak in the second p-type layer 52. As described above, the second p-type layer 52 contains Al.

Furthermore, as shown in FIG. 5, in the first p-type layer 51, the Mg concentration C(Mg) (that is, the first concentration C1) is about $1 \times 10^{21}$ cm$^{-3}$. The Mg concentration C(Mg) in the third p-type layer 53 (that is, the third concentration C3) is about $2 \times 10^{19}$ cm$^{-3}$, and is substantially constant. The Mg concentration C(Mg) in the fourth p-type layer 54 rises from $2 \times 10^{19}$ cm$^{-3}$ to $1 \times 10^{20}$ cm$^{-3}$ along −Z direction. That is, the Mg concentration C(Mg) in the fourth p-type layer 54 decreases from $1 \times 10^{20}$ cm$^{-3}$ to $2 \times 10^{19}$ cm$^{-3}$ along the +Z direction. The Mg concentration C(Mg) in the second p-type layer 52 (that is, the second concentration C2) is about $1 \times 10^{20}$ cm$^{-3}$.

As described above, the semiconductor light emitting device 110a has the p-type impurity concentration profile (Mg doping profile) as exemplified in FIG. 1.

That is, the Mg concentration C(Mg) starts from the second concentration C2 of the second p-type layer 52, decreases in the fourth p-type layer 54, reaches the lowest third concentration C3 in the third p-type layer 53, and reaches the highest first concentration C1 in the first p-type layer 51, along the +Z direction.

In the semiconductor light emitting device 110 (110a and 111, hereinafter the same) according to the embodiment, the impurity concentration in the second p-type layer 52 (the second concentration C2) is set to be a moderate value. The second concentration C2 is set, for example, to be not less than $2.5 \times 10^{19}$ cm$^{-3}$ and less than $2 \times 10^{20}$ cm$^{-3}$. When the second concentration C2 is lower than $2.5 \times 10^{19}$ cm$^{-3}$, the injection of holes into the light emitting part 40 decreases. Consequently, the light emission efficiency lowers. When the second concentration C2 is $2 \times 10^{20}$ cm$^{-3}$ or more, defect tends to occur easily in the crystal. Consequently, the light emission efficiency lowers. By setting the second concentration C2 in a moderate and appropriate range of not less than $2.5 \times 10^{19}$ cm$^{-3}$ and less than $2 \times 10^{20}$ cm$^{-3}$, a high light emission efficiency may be obtained.

On the other hand, the impurity concentration in the first p-type layer 51 (the first concentration C1) to be the p-side contact layer is set higher than the second concentration C2. The first concentration C1 is, for example, $2 \times 10^{20}$ cm$^{-3}$ or more. This makes it possible to lower sufficiently the contact resistance between the p-type semiconductor layer 50 and the p-side electrode 80. When the first concentration C1 is lower than $2 \times 10^{20}$ cm$^{-3}$, the contact resistance becomes high, and the operating voltage rises.

As described above, the first concentration C1 in the first p-type layer 51 is set to be a very high value. Consequently, when the thickness of the first p-type layer 51 becomes a certain value or more, the quality of the crystal tends to lower easily. The thickness of the first p-type layer 51 (the first thickness t51) is set, for example, to be less than 10 nm. This makes it possible to maintain a high crystal quality. Meanwhile, when the first thickness t51 is smaller than 1 nm, contact properties tend to deteriorate easily. Consequently, the first thickness t51 is set, for example, to be not less than 1 nm and less than 10 nm.

At this time, when the first p-type layer 51 having a high impurity concentration is formed in a state of contacting the second p-type layer 52 having a moderate impurity concentration, a region having a high impurity concentration is to have a thickness of a certain level or greater, and, therefore, defect tends to occur easily in the crystal. Consequently, in the embodiment, an intermediate layer having a low impurity concentration is disposed between the first p-type layer 51 and the second p-type layer 52. The intermediate layer corresponds to the third p-type layer 53 and the fourth p-type layer 54.

As exemplified in FIG. 1, the change in the impurity concentration between the first p-type layer 51 and the third p-type layer 53 (the change between the first concentration C1 and the third concentration C3) is stepwise. This reduces the thickness of a region having a high impurity concentration. This suppresses the generation of defect in the crystal.

The change in the impurity concentration between the third p-type layer 53 and the second p-type layer 52 (the change between the third concentration C3 and the second concentration C2) is in a slope shape. The part in which the impurity concentration changes in a slope shape corresponds to the fourth p-type layer 54. The second concentration C2 is a moderate concentration, and, therefore, even when the impurity concentration changes in a slope shape between the third concentration C3 and the second concentration C2, defect does not tend to occur easily in the crystal.

By changing the impurity concentration in a slope shape in the fourth p-type layer 54 between the second p-type layer 52 and the third p-type layer 53, the resistance (series resistance) in the fourth p-type layer 54 may be lowered. This lowers the operating voltage.

Meanwhile, it is difficult to change stepwise the impurity concentration between the third concentration C3 and the second concentration C2 in manufacturing. From this viewpoint, too, in the embodiment, a layer having an inclined impurity concentration (the fourth p-type layer 54) is disposed between the third p-type layer 53 and the second p-type layer 52. This gives a semiconductor light emitting device that may be manufactured easily.

As described above, according to the embodiment, the injection efficiency of holes is improved. This enhances the light emission efficiency. The resistance (series resistance) in the p-type semiconductor layer 50 may be lowered and the operating voltage may be reduced. Furthermore, the manufacturing is easy.

The embodiment provides a semiconductor light emitting device with a high efficiency and low operating voltage.

Figure 6A:
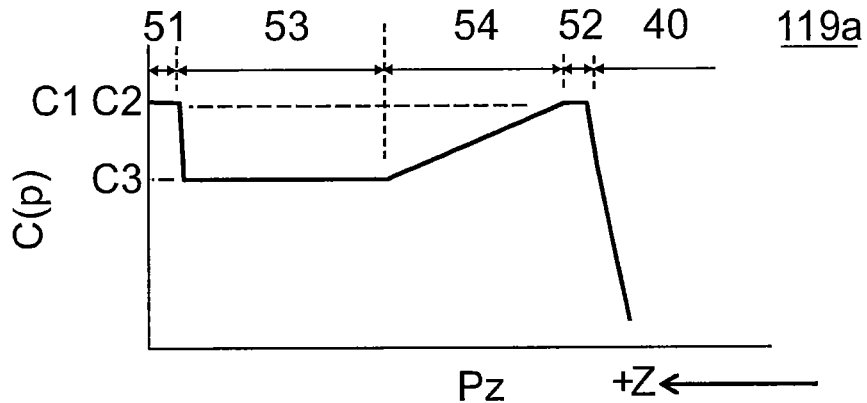
FIG. 6A to FIG. 6C are schematic views showing semiconductor light emitting devices of reference examples.
Figure 6B:
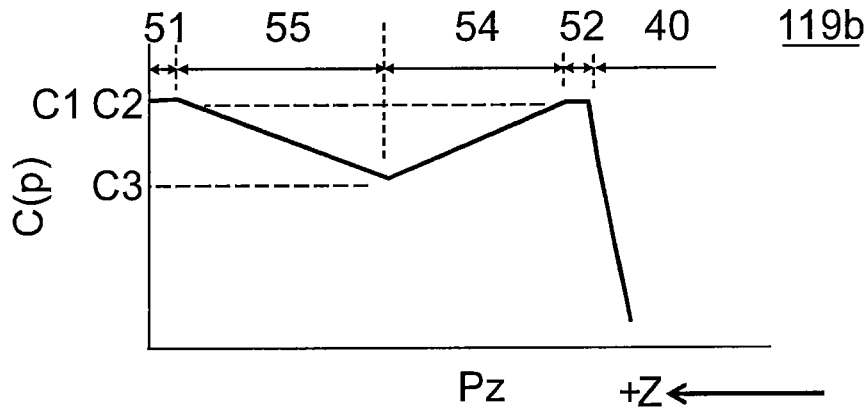
Figure 6C:
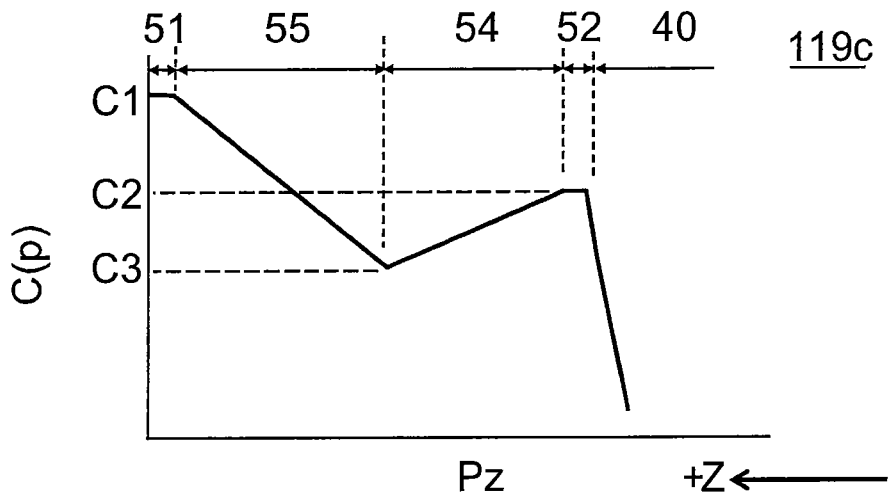

FIG. 6A to FIG. 6C are schematic views illustrating the configuration of semiconductor light emitting devices of reference examples.

Figure 7A:
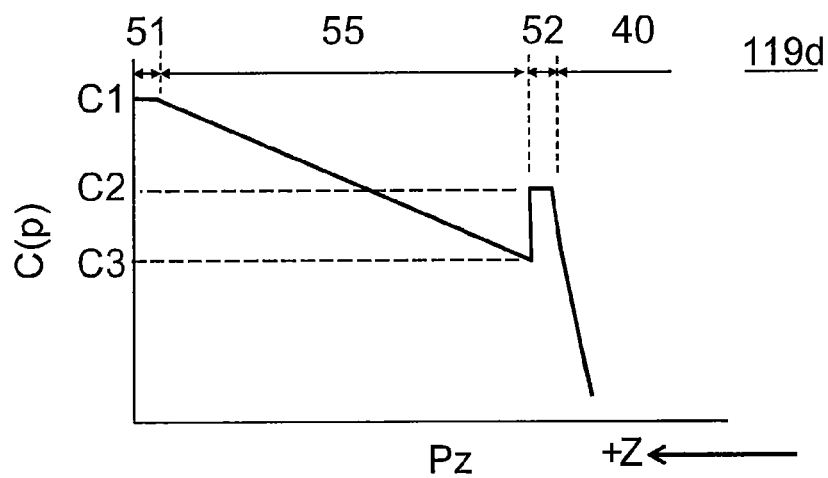
FIG. 7A to FIG. 7C are schematic views showing semiconductor light emitting devices of reference examples.
Figure 7B:
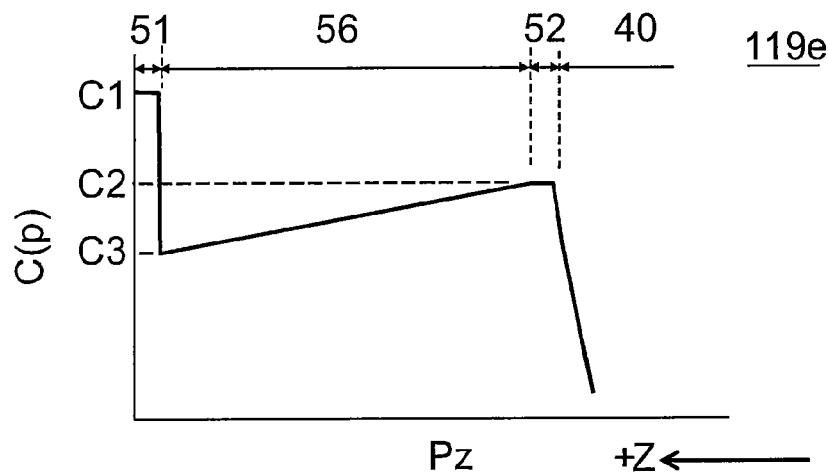
Figure 7C:
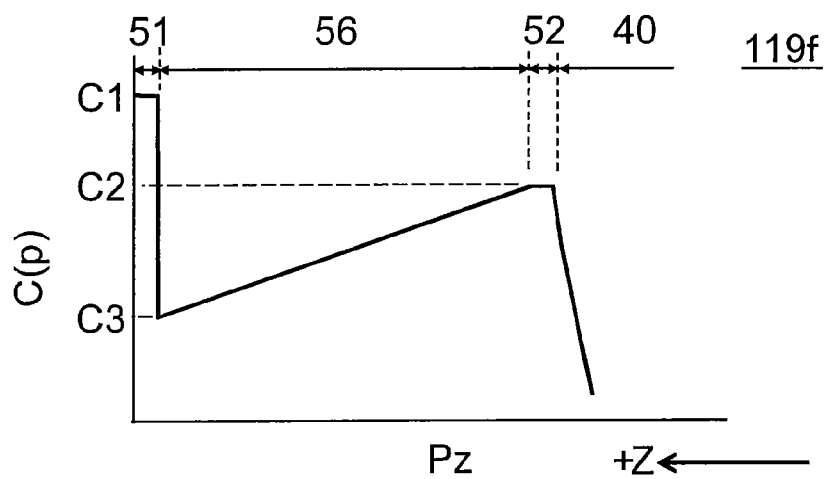

FIG. 7A to FIG. 7C are schematic views illustrating the configuration of semiconductor light emitting devices of reference examples.

Figure 8A:
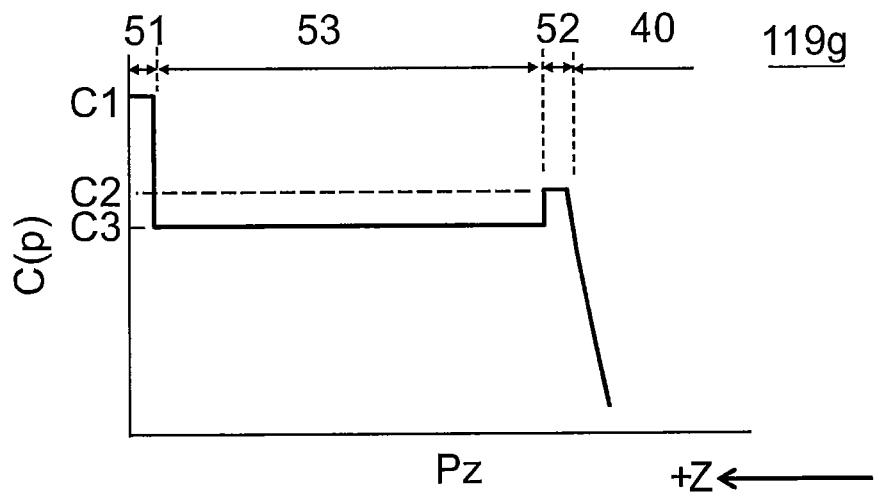
FIG. 8A and FIG. 8B are schematic views showing semiconductor light emitting devices of reference examples.
Figure 8B:
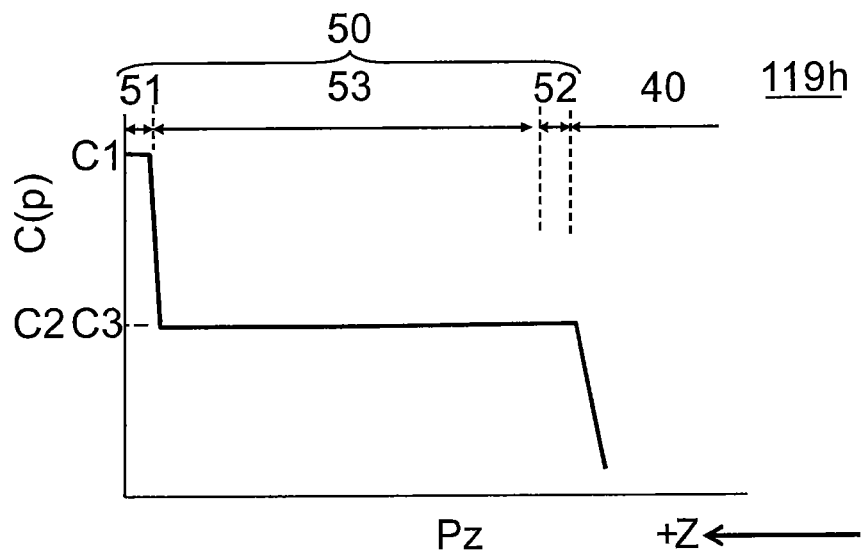

FIG. 8A and FIG. 8B are schematic views illustrating the configuration of semiconductor light emitting devices of reference examples.

That is, these drawings show the p-type impurity concentration C(p) (for example, the Mg concentration C(Mg)) in the p-type semiconductor layer 50 of semiconductor light emitting devices of reference examples.

As shown in FIG. 6A, in a semiconductor light emitting device 119a in a first reference example, too, the first to fourth p-type layers 51 to 54 are disposed, but the first concentration C1 is equivalent to the second concentration C2. In such first reference example, when the first concentration C1 and the second concentration C2 are set to be a high value of $2 \times 10^{20}$ cm$^{-3}$ or more, the second concentration C2 is too high and, therefore, the crystal quality deteriorates and the light emission efficiency lowers. When the first concentration C1 and the second concentration C2 are set to be a moderate value of not less than $2.5 \times 10^{19}$ cm$^{-3}$ and less than $2 \times 10^{20}$ cm$^{-3}$, the contact resistance rises.

As shown in FIG. 6B, in a semiconductor light emitting device 119b in a second reference example, a graded layer 55 is disposed between the first p-type layer 51 and the fourth p-type layer 54. The impurity concentration C(p) in the graded layer 55 increases from the third concentration C3 to the first concentration C1 along the +Z direction. The first concentration C1 is equivalent to the second concentration C2. In this case, too, when the first concentration C1 and the second concentration C2 are high, the crystal quality deteriorates. When the first concentration C1 and the second concentration C2 are set to be a moderate value, the contact resistance rises.

As shown in FIG. 6C, in a semiconductor light emitting device 119c in a third reference example, the graded layer 55 is disposed between the first p-type layer 51 and the fourth p-type layer 54. The impurity concentration C(p) in the graded layer 55 increases from the third concentration C3 to the first concentration C1 along the +Z direction. The first concentration C1 is higher than the second concentration C2. Since the first concentration C1 is high, the contact resistance is considered to be low. Since the second concentration C2 is set to be a moderate value, the injection efficiency of holes is considered to be high. However, in the graded layer 55 between the first p-type layer 51 and the fourth p-type layer 54, the impurity concentration changes in a slope shape. Consequently, in the graded layer 55, the thickness of a region in which the p-type impurity concentration is high exceeds a certain value. Consequently, defect tends to occur easily in the crystal. Consequently, the light emission efficiency is low.

As shown in FIG. 7A, in a semiconductor light emitting device 119d in a fourth reference example, the graded layer 55 is disposed between the first p-type layer 51 and the second p-type layer 52. And, the fourth p-type layer 54 is not disposed. The impurity concentration C(p) in the graded layer 55 increases from the third concentration C3 to the first concentration C1 along the +Z direction. And, the first concentration C1 is higher than the second concentration C2. In this case, too, it is considered that the contact resistance is low and the injection efficiency of holes is high. However, the impurity concentration changes in a slope shape in the graded layer 55. Consequently, in the graded layer 55, the thickness of a region in which the p-type impurity concentration is high exceeds a certain value. Consequently, defect tends to occur easily in the crystal. Consequently, the light emission efficiency is low.

As shown in FIG. 7B, in a semiconductor light emitting device 119e in a fifth reference example, a graded layer 56 is disposed between the first p-type layer 51 and the second p-type layer 52. The impurity concentration C(p) in the graded layer 56 decreases from the second concentration C2 to the third concentration C3 along the +Z direction. And, the first concentration C1 is higher than the second concentration C2. In this case, too, it is considered that the contact resistance is low and the injection efficiency of holes is high. However, the impurity concentration changes in a slope shape in the graded layer 56. Consequently, defect tends to occur easily in the crystal.

As shown in FIG. 7C, in a semiconductor light emitting device 119f in a sixth reference example, the graded layer 56 is disposed between the first p-type layer 51 and the second p-type layer 52. The impurity concentration C(p) in the graded layer 56 decreases from the second concentration C2 to the third concentration C3 along the +Z direction. And the first concentration C1 is higher than the second concentration C2. In the semiconductor light emitting device 119f, the third concentration C3 is set to be very low. In this case, too, it is considered that the contact resistance is low and the injection efficiency of holes is high. Although the impurity concentration changes in a slope shape in the graded layer 56, the third concentration C3 is low, and, therefore, the generation of the crystal defect is suppressed. However, since the third concentration C3 is low, the average impurity concentration of the graded layer 56 is low. Consequently, the resistance (series resistance) of the graded layer 56 becomes high. Consequently, the operating voltage is high.

As shown in FIG. 8A, in a semiconductor light emitting device 119g in a seventh reference example, the third p-type layer 53 is disposed, but the fourth p-type layer 54 is not disposed, between the first p-type layer 51 and the second p-type layer 52. And, the first concentration C1 is higher than the second concentration C2. In this case, too, it is considered that the contact resistance is low and the injection efficiency of holes is high. However, when the third concentration C3 is set to be high, defect tends to occur easily in the crystal. When the third concentration C3 is set to be low, the resistance (series resistance) becomes high. Since the impurity concentration changes stepwise between the second p-type layer 52 and the third p-type layer 53, the control of the manufacturing condition is difficult.

As shown in FIG. 8B, in a semiconductor light emitting device 119h in an eighth reference example, the second concentration C2 of the second p-type layer 52 is low. The second concentration C2 is approximately at the same level as the third concentration C3. The fourth p-type layer 54 is not disposed substantially. In the example, the energy band in the second p-type layer 52 relatively lowers and the quantum confinement effect lowers. Consequently, the light emission efficiency lowers. Then, the injection of holes into the light emitting part 40 decreases. Consequently, the light emission efficiency lowers.

As described above, in the semiconductor light emitting devices 119a to 119h in the first to eighth reference examples, it is difficult to obtain simultaneously a high efficiency and a low operating voltage.

In contrast, the semiconductor light emitting device according to the embodiment gives simultaneously a high efficiency and a low operating voltage. Furthermore, the manufacturing is easy.

Properties of the semiconductor light emitting device 110 according to the embodiment and the semiconductor light emitting devices in reference examples were simulated.

Hereinafter, the results of the simulation of properties are explained about the semiconductor light emitting device 110 according to the embodiment, the semiconductor light emitting device 119a in the first reference example, the semiconductor light emitting device 119e in the fifth reference example, and the semiconductor light emitting device 119h in the eighth reference example.

The simulation was performed under conditions below.

In the semiconductor light emitting device 110, the first concentration C1 (the Mg concentration) was set to be $1 \times 10^{21}$ cm$^{-3}$. The second concentration C2 (the Mg concentration) was set to be $1 \times 10^{20}$ cm$^{-3}$. The third concentration C3 (the Mg concentration) was set to be $2 \times 10^{19}$ cm$^{-3}$. The Mg concentration C(Mg) in the fourth p-type layer 54 was set to lower linearly from $1 \times 10^{20}$ cm$^{-3}$ to $2 \times 10^{19}$ cm$^{-3}$ along the +Z direction. The first thickness t51 and the second thickness t52 were set to be 5 nm. The third thickness t53 and the fourth thickness t54 were set to be 40 nm.

In the semiconductor light emitting device 119a, it was set so that the first concentration C1=the second concentration C2=$1 \times 10^{20}$ cm$^{-3}$, the third concentration C3=$2 \times 10^{19}$ cm$^{-3}$, and the first thickness t51, the second thickness t52, the third thickness t53 and the fourth thickness t54 were the same as those in the semiconductor light emitting device 110.

In the semiconductor light emitting device 119e, it was set so that the first concentration C1=$1 \times 10^{21}$ cm$^{-3}$, the second concentration C2=$1 \times 10^{20}$ cm$^{-3}$, the third concentration C3=$1 \times 10^{18}$ cm$^{-3}$, and the first thickness t51 and the second thickness t52 were the same as those in the semiconductor light emitting device 110. And the thickness of the graded layer 56 was set to be 80 nm.

In the semiconductor light emitting device 119h, it was set so that the first concentration C1=$1 \times 10^{21}$ cm$^{-3}$, the second concentration C2=the third concentration C3=$1 \times 10^{19}$ cm$^{-3}$, and the first thickness t51 and the second thickness t52 were the same as those in the semiconductor light emitting device 110. And the third thickness t53 was set to be 80 nm.

Figure 9:
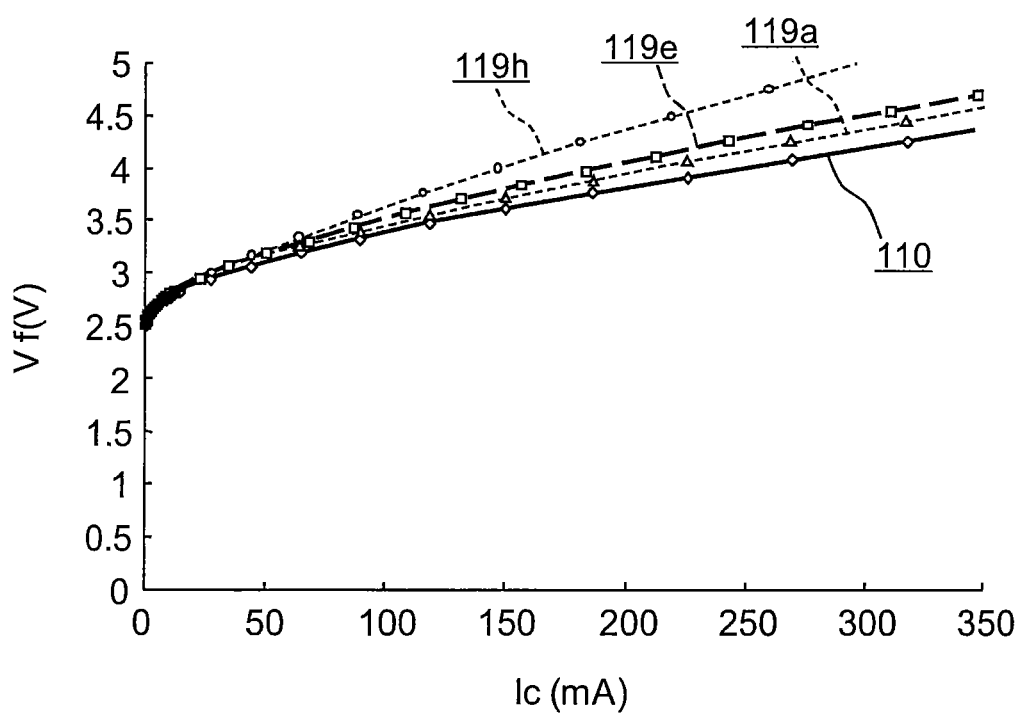
FIG. 9 is a graph showing characteristics of semiconductor light emitting devices.

FIG. 9 is a graph illustrating characteristics of semiconductor light emitting devices.

That is, the graph shows the result of the simulation described above. In FIG. 9, the horizontal axis shows the injection current Ic that is caused to flow in the semiconductor light emitting device. The vertical axis shows the operating voltage Vf.

As is known from FIG. 9, the operating voltage Vf of the semiconductor light emitting device 110 according to the embodiment is lower than that of any of the semiconductor light emitting devices 119a, 119e and 119h in reference examples.

The lowering effect of the drive voltage Vf according to the embodiment is particularly remarkable in regions where the injection current Ic is large.

Moreover, in the embodiment, the light output increases.

For example, in the semiconductor light emitting device 110 according to the embodiment, when the injection current Ic is 20 milliampere (mA), the operating voltage Vf is 2.88 volt (V), and the light output at this time is estimated as 28 milliwatt (mW).

On the other hand, in the semiconductor light emitting device 119h in the eighth reference example, when the injection current Ic is 20 mA, the operating voltage Vf is 2.94 V, and the light output at this time is estimated as 24 mW.

As described above, in the semiconductor light emitting device 110 according to the embodiment, the light output is high, and the efficiency is high. And the operating voltage Vf is low.

In the semiconductor light emitting device 110 (including 111) according to the embodiment, the thickness of the first p-type layer 51 along the +Z direction (first thickness t51) is, for example, not less than 1 nm and less than 10 nm. The first thickness t51 is, for example, 5 nm. The thickness of the second p-type layer 52 along the +Z direction (second thickness t52) is, for example, not less than 1 nm and less than 10 nm. The second thickness t52 is, for example, 5 nm. The thickness of the third p-type layer 53 along the +Z direction (third thickness t53) is, for example, not less than 10 nm and less than 80 nm. The third thickness t53 is, for example, 40 nm. The thickness of the fourth p-type layer 54 along the +Z direction (fourth thickness t54) is, for example, not less than 10 nm and less than 80 nm. The fourth thickness t54 is, for example, 40 nm.

The third thickness t53 is substantially equal to the fourth thickness t54. The difference between the third thickness t53 and the fourth thickness t54 is smaller than the difference between the third thickness t53 and the first thickness t51, and is smaller than the difference between the third thickness t53 and the second thickness t52. The difference between the third thickness t53 and the fourth thickness t54 is smaller than the difference between the fourth thickness t54 and the first thickness t51, and is smaller than the difference between the fourth thickness t54 and the second thickness t52.

The setting of the third thickness t53 to be substantially equal to the fourth thickness t54 as described above makes it easy to control appropriately the profile of the p-type impurity concentration.

The first thickness t51 is smaller than the third thickness t53, and is smaller than the fourth thickness t54. And, the second thickness t52 is smaller than the third thickness t53, and is smaller than the fourth thickness t54. The setting of the first thickness t51 and the second thickness t52 to be smaller than the third thickness t53 and the fourth thickness t54 makes it easy to suppress the generation of defect in the crystal.

The first thickness t51 has a value close to that of the second thickness t52. The difference between the first thickness t51 and the second thickness t52 is smaller than the difference between the first thickness t51 and the third thickness t53, and is smaller than the difference between the first thickness t51 and the fourth thickness t54. The difference between the first thickness t51 and the second thickness t52 is smaller than the difference between the second thickness t52 and the third thickness t53, and is smaller than the difference between the second thickness t52 and the fourth thickness t54.

As the method for growing respective semiconductor layers in the semiconductor light emitting device according to the embodiment, for example, a metal organic chemical vapor deposition (MOCVD) method, a molecular beam epitaxy (MBE) method, etc. are used.

The following may be used as raw materials when forming respective semiconductor layers.

As the raw material of Ga, for example, TMGa (trimethyl gallium), TEGa (triethyl gallium) etc. may be used. As the raw material of In, for example, TMIn (trimethyl indium), TEIn (triethyl indium) etc. may be used. As the raw material of Al, for example, TMAl (trimethyl aluminum) etc. may be used. As the raw material of N, for example, $NH_3$ (ammonia), MMHy (monomethyl hydrazine), DMHy (dimethyl hydrazine) etc. may be used. As the raw material of Si, for example, $SiH_4$ (monosilane) etc. may be used. As the raw material of Mg, for example, $Cp_2Mg$ (biscyclopentadienyl magnesium) etc. may be used.

The embodiment provides a semiconductor light emitting device of a high efficiency and a low operating voltage.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices such as the n-type semiconductor layer, the p-type semiconductor layer, the light emitting part, the well layer, the barrier layer and the electrode from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a first semiconductor layer of a first conductivity-type;
   a second semiconductor layer of a second conductivity-type;
   a light emitting part provided between the first semiconductor layer and the second semiconductor layer, the light emitting part including a plurality of barrier layers and a plurality of well layers, the well layers including In; and
   an electrode contacting the second semiconductor layer, the second semiconductor layer including:
   a first region contacting the electrode and containing an impurity of the second conductivity-type in a first concentration;
   a second region contacting the light emitting part, containing Al and containing an impurity of the second conductivity-type in a second concentration lower than the first concentration;
   a third region provided between the first region and the second region, the third region containing an impurity of the second conductivity-type in a third concentration lower than the second concentration; and
   a fourth region provided between the second region and the third region, the fourth region having a concentration of an impurity of the second conductivity-type decreasing from the second concentration to the third concentration along a first direction from the first semiconductor layer toward the second semiconductor layer,
   wherein the first region is a GaN, the second region is an AlGaN, the third region is a GaN, and the fourth region is a GaN;
   wherein the first region is thinner than the third region, and thinner than the fourth region;
   wherein the second region is thinner than the third region, and thinner than the fourth region;
   wherein the third region has not less than 10 nanometers thickness;
   wherein the third concentration is not less than $1 \times 10^{19}$ $cm^{-3}$ and less than $2.5 \times 10^{19}$ $cm^{-3}$;
   wherein the third concentration is constant and has a variation within plus minus 20% of an average value of the third concentration; and
   wherein the third concentration has the lowest concentration of the impurity of the second conductivity-type in the second semiconductor layer.

2. The device according to claim 1, wherein the first concentration is $2 \times 10^{20}$ $cm^{-3}$ or more.

3. The device according to claim 1, wherein the second concentration is not less than $2.5 \times 10^{19}$ $cm^{-3}$ and less than $2 \times 10^{20}$ $cm^{-3}$.

4. The device according to claim 1, wherein
   the first concentration is a concentration of Mg in the first region, the second concentration is a concentration of Mg in the second region, the third concentration is a concentration of Mg in the third region, and the concentration of the impurity of the second conductivity-type in the fourth region is a concentration of Mg in the fourth region.

5. The device according to claim 1, wherein the third concentration is not less than 0.05 times the second concentration and not more than 0.8 times the second concentration.

6. The device according to claim 1, wherein a Mg concentration in the fourth region decreases from a value of $2.5 \times 10^{19}$ cm$^{-3}$ or more to a values of less than $2.5 \times 10^{19}$ cm$^{-3}$ along the first direction.

7. The device according to claim 1, wherein a thickness of the first region is not less than 1 nanometer and less than 10 nanometers.

8. The device according to claim 1, wherein a thickness of the second region is not less than 1 nanometer and less than 10 nanometers.

9. The device according to claim 1, wherein a thickness of the third region is not less than 10 nanometers and not more than 80 nanometers.

10. The device according to claim 1, wherein a thickness of the fourth region is not less than 10 nanometers and not more than 80 nanometers.

11. The device according to claim 1, wherein the electrode includes a metal oxide and is translucent for light emitted from the light emitting part.

12. The device according to claim 1, wherein the well layer includes InGaN, and the barrier layer includes GaN.

13. The device according to claim 1, wherein a peak wavelength of light emitted from the light emitting part is not less than 380 nanometers and not more than 550 nanometers.

14. The device according to claim 1, wherein a composition ratio of In among Group III elements in the at least one of the well layers is not less than 0.05 and not more than 0.3.

15. The device according to claim 1, wherein the concentration of the impurity of the second conductivity-type in the fourth region decreases from the second concentration to the third concentration stepwisely.

16. The device according to claim 1, wherein the fourth region includes a first part and a second part, the second part being provided between the first part and the third region, wherein a rate of the decreasing of the impurity of the second conductivity-type in the first part is larger than a rate of the decreasing of the impurity of the second conductivity-type in the second part.

* * * * *